(12) United States Patent
Dusan et al.

(10) Patent No.: US 9,997,173 B2
(45) Date of Patent: Jun. 12, 2018

(54) SYSTEM AND METHOD FOR PERFORMING AUTOMATIC GAIN CONTROL USING AN ACCELEROMETER IN A HEADSET

(71) Applicant: Apple Inc., Cupertino, CA (US)

(72) Inventors: Sorin V. Dusan, San Jose, CA (US);
Baptiste Paquier, Saratoga, CA (US);
Aram Lindahl, Menlo Park, CA (US);
Dubravko Biruski, Cupertino, CA (US)

(73) Assignee: APPLE INC., Cupertino, CA (US)

( * ) Notice: Subject to any disclaimer, the term of this patent is extended or adjusted under 35 U.S.C. 154(b) by 72 days.

(21) Appl. No.: 15/069,808

(22) Filed: Mar. 14, 2016

(65) Prior Publication Data

US 2017/0263267 A1 Sep. 14, 2017

(51) Int. Cl.
*G10L 19/24* (2013.01)
*G10L 25/78* (2013.01)
(Continued)

(52) U.S. Cl.
CPC ............ *G10L 25/78* (2013.01); *G10L 21/034* (2013.01); *G10L 21/0388* (2013.01);
(Continued)

(58) Field of Classification Search
CPC ....... G10L 21/0208; G10L 2021/02165; G10L 2021/02166; G10L 15/30; G10L 2021/02161; G10L 2021/02168; G10L 25/78; G10L 15/02; G10L 15/04; G10L 15/26; G10L 15/32; G10L 19/0204; G10L 2021/02082; G10L 2025/783; G10L 21/02; G10L 21/0205; G10L 21/0216; G10L 21/0308; G10L 25/45; G10L 25/84; G10L 25/90; G10L 25/93; H04R 3/005; H04R 1/1083; H04R 5/033; H04R 1/46; H04R 2460/01; H04R 2460/13; H04R 1/1016; H04R 1/1033; H04R 1/1041; H04R 1/222; H04R 2201/107; H04R 2201/22; G06F 17/289; G10K 11/1784; G10K 11/1788; G10K 2210/30232; G10K 2210/3028; G10K 2210/3045
(Continued)

(56) References Cited

U.S. PATENT DOCUMENTS 5,692,059 A * 11/1997 Kruger ................ H04R 1/1016
381/151
8,019,091 B2 9/2011 Burnett et al.
(Continued)

*Primary Examiner* — Vijay B Chawan
(74) *Attorney, Agent, or Firm* — Womble Bond Dickinson (US) LLP

(57) ABSTRACT

A method performing automatic gain control (AGC) using an accelerometer in a headset starts with an accelerometer-based voice activity detector (VADa) generating a VADa output based on (i) acoustic signals received from at least one microphone included in a pair of earbuds and (ii) data output by at least one accelerometer that is included in the pair of earbuds. The at least one accelerometer detects vibration of the user's vocal chords. The headset includes the pair of earbuds. An AGC controller then performs automatic gain control (AGC) on the acoustic signals from the at least one microphone based on the VADa output. Other embodiments are also described.

26 Claims, 6 Drawing Sheets

(51) Int. Cl.
  *G10L 25/90* (2013.01)
  *G10L 21/0388* (2013.01)
  *G10L 21/034* (2013.01)
  *G10L 21/0216* (2013.01)
(52) U.S. Cl.
  CPC .... *G10L 25/90* (2013.01); *G10L 2021/02166* (2013.01); *G10L 2025/783* (2013.01)
(58) Field of Classification Search
  USPC ... 381/94.1, 13, 17, 71.1, 71.6, 71.8, 74, 92, 381/94.3, 94.7; 704/226, 227, 233, 2, 704/215, 235, 246, 247, 270.1, 270, 275
  See application file for complete search history.

(56) References Cited

U.S. PATENT DOCUMENTS

| | | | |
|---|---|---|---|
| 8,467,543 B2 * | 6/2013 | Burnett | G10L 21/0208 381/92 |
| 8,942,383 B2 | 1/2015 | Petit | |
| 8,983,093 B2 | 3/2015 | Smith et al. | |
| 9,037,458 B2 * | 5/2015 | Park | G06F 17/289 381/13 |
| 9,516,442 B1 * | 12/2016 | Dusan | H04R 29/001 |
| 2003/0004720 A1 * | 1/2003 | Garudadri | G10L 15/30 704/247 |
| 2003/0179888 A1 * | 9/2003 | Burnett | G10L 21/0208 381/71.8 |
| 2004/0133421 A1 * | 7/2004 | Burnett | G10L 21/02 704/215 |
| 2004/0243416 A1 * | 12/2004 | Gardos | G10L 15/25 704/275 |
| 2007/0061147 A1 * | 3/2007 | Monne | G10L 15/32 704/270.1 |
| 2009/0264789 A1 * | 10/2009 | Molnar | A61N 1/36135 600/544 |
| 2009/0274299 A1 * | 11/2009 | Caskey | G06F 17/289 380/255 |
| 2011/0161085 A1 * | 6/2011 | Boda | G06Q 30/02 704/260 |
| 2011/0257464 A1 * | 10/2011 | Kehoe | A61F 5/58 600/23 |
| 2012/0072211 A1 * | 3/2012 | Edgington | G10L 15/04 704/231 |
| 2012/0209603 A1 | 8/2012 | Jing | |
| 2012/0215519 A1 * | 8/2012 | Park | G06F 17/289 704/2 |
| 2012/0215528 A1 * | 8/2012 | Nagatomo | G10L 15/30 704/211 |
| 2012/0221330 A1 * | 8/2012 | Thambiratnam | G10L 25/84 704/235 |
| 2013/0013315 A1 * | 1/2013 | Burke | G06F 3/0346 704/270 |
| 2013/0085753 A1 * | 4/2013 | Bringert | G10L 15/32 704/233 |
| 2013/0332156 A1 | 12/2013 | Tackin et al. | |
| 2014/0093093 A1 | 4/2014 | Dusan et al. | |
| 2014/0270231 A1 * | 9/2014 | Dusan | G10L 25/90 381/74 |
| 2014/0270259 A1 | 9/2014 | Goertz et al. | |
| 2014/0330557 A1 * | 11/2014 | Huber | A61F 5/58 704/225 |
| 2014/0365215 A1 * | 12/2014 | Kim | G10L 15/22 704/235 |
| 2015/0088525 A1 * | 3/2015 | Shan | G10L 15/22 704/275 |
| 2015/0245129 A1 * | 8/2015 | Dusan | H04R 1/1083 381/71.6 |

* cited by examiner

SYSTEM AND METHOD FOR PERFORMING AUTOMATIC GAIN CONTROL USING AN ACCELEROMETER IN A HEADSET

FIELD

Embodiments of the invention relate generally to a system and method of performing automatic gain control (AGC) using an accelerometer in a headset. Specifically, at least one accelerometer is included in a pair of earbuds to detect vibration of the user's vocal chords. The at least one accelerometer is used to generate data output that is used by an accelerometer-based voice activity detector (VADa) to generate a VADa output. The VADa is a more robust voice activity detector that is less affected by ambient acoustic noise. The VADa output is then used to perform the AGC on the acoustic signals received from at least one microphone included in the pair of earbuds. In some embodiments, a pitch estimate may be generated based on the signals from the at least one accelerometer. The pitch estimate may also be used to perform AGC on the acoustic signals. In another embodiment, the VADa output and the pitch estimate may be used to encoding.

BACKGROUND

Currently, a number of consumer electronic devices are adapted to receive speech via microphone ports or headsets. While the typical example is a portable telecommunications device (mobile telephone), with the advent of Voice over IP (VoIP), desktop computers, laptop computers and tablet computers may also be used to perform voice communications.

When using these electronic devices, the user also has the option of using the speakerphone mode or a wired headset to receive his speech. However, a common complaint with these hands-free modes of operation is that the speech captured by the microphone port or the headset includes environmental noise such as wind noise, secondary speakers in the background or other background noises. This environmental noise often renders the user's speech unintelligible and thus, degrades the quality of the voice communication.

SUMMARY

Generally, the invention relates to performing automatic gain control (AGC) using an accelerometer included in an earbud of an enhanced headset for use with the electronic devices. Specifically, the invention discloses using an accelerometer-based voice activity detector (VADa) to generate a VADa output that is more robust to noise and performing automatic gain control (AGC) on acoustic signals based on the VADa output. The invention also discloses generating a pitch estimate using the signals from the accelerometer and performing AGC on acoustic signals based on the pitch estimate.

In one embodiment, a method of performing AGC using an accelerometer in a headset starts with an accelerometer-based voice activity detector (VADa) generating a VADa output based on (i) acoustic signals received from at least one microphone included in a pair of earbuds and (ii) data output by at least one accelerometer that is included in the pair of earbuds. The at least one accelerometer detects vibration of the user's vocal chords and the headset includes the pair of earbuds. An AGC controller performs AGC on the acoustic signals from the at least one microphone based on the VADa output.

In another embodiment, a system for performing automatic gain control (AGC) using an accelerometer in a headset comprises the headset including a pair of earbuds, an equalizer and an AGC controller. Each of the earbuds includes at least one microphone and at least one accelerometer to detect vibration of the user's vocal chords. Equalizer includes an accelerometer-based voice activity detector (VADa) to generate a VADa output based on (i) acoustic signals received from at least one microphone included in the pair of earbuds and (ii) data output by at least one accelerometer that is included in the pair of earbuds. AGC controller performs AGC on acoustic signals from at least one microphone based on VADa output.

The above summary does not include an exhaustive list of all aspects of the present invention. It is contemplated that the invention includes all systems, apparatuses and methods that can be practiced from all suitable combinations of the various aspects summarized above, as well as those disclosed in the Detailed Description below and particularly pointed out in the claims filed with the application. Such combinations may have particular advantages not specifically recited in the above summary.

BRIEF DESCRIPTION OF THE DRAWINGS

The embodiments of the invention are illustrated by way of example and not by way of limitation in the figures of the accompanying drawings in which like references indicate similar elements. It should be noted that references to "an" or "one" embodiment of the invention in this disclosure are not necessarily to the same embodiment, and they mean at least one. In the drawings.

DETAILED DESCRIPTION

In the following description, numerous specific details are set forth. However, it is understood that embodiments of the invention may be practiced without these specific details. In other instances, well-known circuits, structures, and techniques have not been shown to avoid obscuring the understanding of this description.

Moreover, the following embodiments of the invention may be described as a process, which is usually depicted as a flowchart, a flow diagram, a structure diagram, or a block diagram. Although a flowchart may describe the operations as a sequential process, many of the operations can be performed in parallel or concurrently. In addition, the order of the operations may be re-arranged. A process is terminated when its operations are completed. A process may correspond to a method, a procedure, etc.

Figure 1:
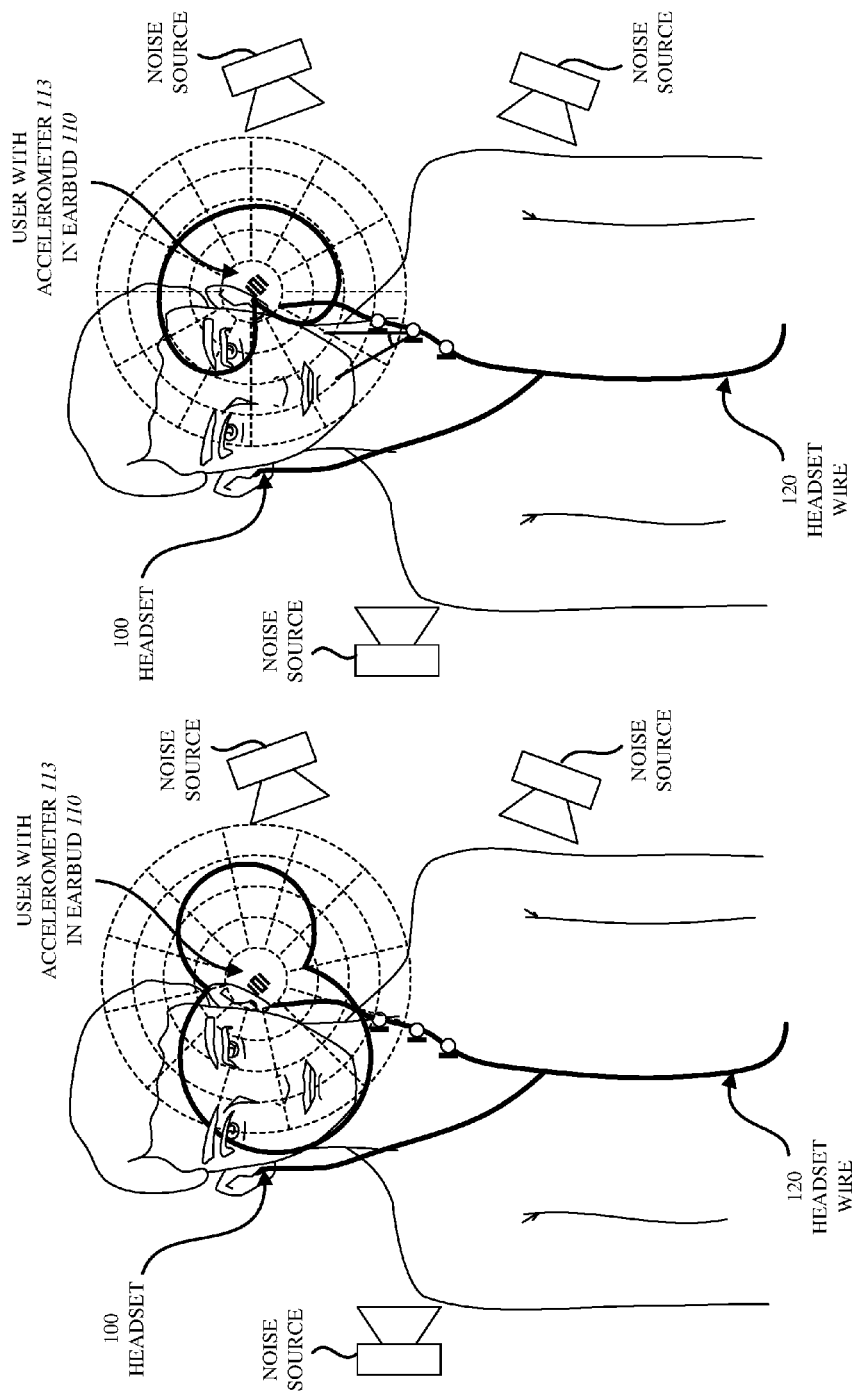
FIG. 1 illustrates an example of the headset in use according to one embodiment of the invention.
Figure 2:
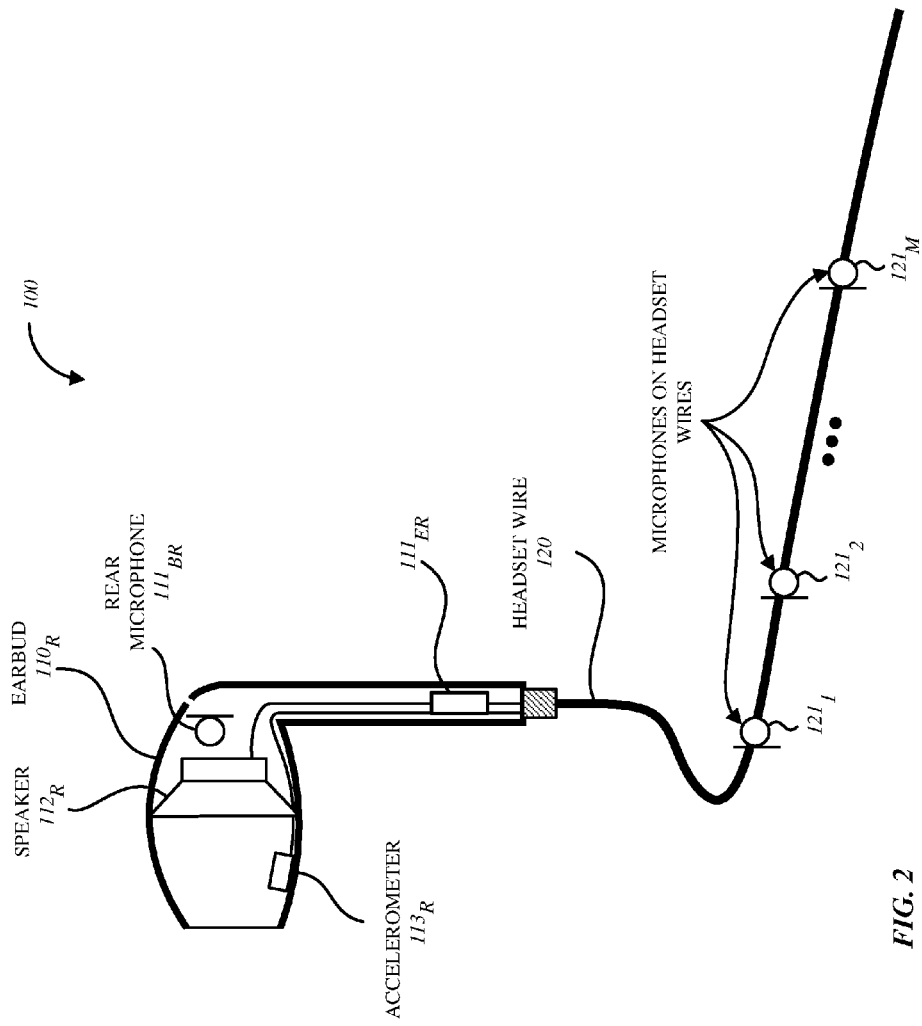
FIG. 2 illustrates an example of the right side of the headset used with a consumer electronic device in which an embodiment of the invention may be implemented.

FIG. 1 illustrates an example of a headset in use that may be coupled with a consumer electronic device 10 according to one embodiment of the invention. As shown in FIGS. 1 and 2, the headset 100 includes a pair of earbuds 110 and a headset wire 120. The user may place one or both the earbuds into his ears and the microphones in the headset 100 may receive his speech. The microphones may be air interface sound pickup devices that convert sound into an electrical signal. The headset 100 in FIG. 1 is double-earpiece headset. It is understood that single-earpiece or monaural headsets may also be used. As the user is using the headset to transmit his speech, environmental noise may also be present (e.g., noise sources in FIG. 1). While the headset 100 in FIG. 2 is an in-ear type of headset that includes a pair of earbuds 110 which are placed inside the user's ears, respectively, it is understood that headsets that include a pair of earcups that are placed over the user's ears may also be used. Additionally, embodiments of the invention may also use other types of headsets. Further, while FIG. 1 includes a headset wire 120, in some embodiments, the earbuds 110 may be wireless and communicate with each other and with the electronic device 10 via BlueTooth™ signals. Thus, the earbuds may not be connected with wires to the electronic device 10 (not shown) or between them, but communicate with each other to deliver the uplink (or recording) function and the downlink (or playback) function.

FIG. 2 illustrates an example of the right side of the headset used with a consumer electronic device in which an embodiment of the invention may be implemented. It is understood that a similar configuration may be included in the left side of the headset 100. As shown in FIG. 2, the earbud $110_R$ includes a speaker $112_R$, an inertial sensor detecting movement such as an accelerometer $113_R$, a rear (or back) microphone $111_{BR}$ that faces the opposite direction of the eardrum, and an end microphone $111_{ER}$ that is located in the end portion of the earbud $110_R$ where it is the closest microphone to the user's mouth. The earbud $110_R$ may also be coupled to the headset wire 120, which may include a plurality of microphones $121_1$-$121_{-M}$ (M>1) distributed along the headset wire that can form one or more microphone arrays. As shown in FIG. 1, the microphone arrays in the headset wire 120 may be used to create microphone array beams (i.e., beamformers) which can be steered to a given direction by emphasizing and deemphasizing selected microphones $121_1$-$121_M$. Similarly, the microphone arrays can also exhibit or provide nulls in other given directions. Accordingly, the beamforming process, also referred to as spatial filtering, may be a signal processing technique using the microphone array for directional sound reception. The headset 100 may also include one or more integrated circuits and a jack to connect the headset 100 to the electronic device 10 (not shown) using digital signals, which may be sampled and quantized.

In one embodiment, each of the earbuds $110_L$, $110_R$ are wireless earbuds and may also include a battery device, a processor, and a communication interface (not shown). In this embodiment, the processor may be a digital signal processing chip that processes the acoustic signal from at least one of the microphones $111_{BR}$, $111_{ER}$ and the inertial sensor output from the accelerometer $113_R$. In one embodiment, the beamformers patterns illustrated in FIG. 1 are formed using the rear microphone $111_{BR}$ and the end microphone $111_{ER}$ to capture the user's speech (left pattern) and to capture the ambient noise (right pattern), respectively.

The communication interface may include a Bluetooth™ receiver and transmitter may communicate acoustic signals from the microphones $111_{BR}$, $111_{ER}$, and the inertial sensor output from the accelerometer $113_R$ wirelessly in both directions (uplink and downlink) with the electronic device. In some embodiments, the communication interface communicates encoded signal from a speech codec 160 to the electronic device 10.

When the user speaks, his speech signals may include voiced speech and unvoiced speech. Voiced speech is speech that is generated with excitation or vibration of the user's vocal chords. In contrast, unvoiced speech is speech that is generated without excitation of the user's vocal chords. For example, unvoiced speech sounds include /s/, /sh/, /f/, etc. Accordingly, in some embodiments, both the types of speech (voiced and unvoiced) are detected in order to generate an augmented voice activity detector (VAD) output, which more faithfully represents the user's speech.

First, in order to detect the user's voiced speech, in one embodiment of the invention, the output data signal from accelerometer 113 placed in each earbud 110 together with the signals from the microphones $111_B$, $111_E$ or the microphone array $121_1$-$121_M$ or the beamformer may be used. The accelerometer 113 may be a sensing device that measures proper acceleration in three directions, X, Y, and Z or in only one or two directions. When the user is generating voiced speech, the vibrations of the user's vocal chords are filtered by the vocal tract and cause vibrations in the bones of the user's head which are detected by the accelerometer 113 in the headset 110. In other embodiments, an inertial sensor, a force sensor or a position, orientation and movement sensor may be used in lieu of the accelerometer 113 in the headset 110.

In the embodiment with the accelerometer 113, the accelerometer 113 is used to detect the low frequencies since the low frequencies include the user's voiced speech signals. For example, the accelerometer 113 may be tuned such that it is sensitive to the frequency band range that is below 2000 Hz. In one embodiment, the signals below 60 Hz-70 Hz may be filtered out using a high-pass filter and above 2000 Hz-3000 Hz may be filtered out using a low-pass filter. In one embodiment, the sampling rate of the accelerometer may be 2000 Hz but in other embodiments, the sampling rate may be between 2000 Hz and 6000 Hz. In another embodiment, the accelerometer 113 may be tuned to a frequency band range under 1000 Hz. It is understood that the dynamic range may be optimized to provide more resolution within a forced range that is expected to be produced by the bone conduction effect in the headset 100. Based on the outputs of the accelerometer 113, an accelerometer-based VAD output (VADa) may be generated, which indicates whether or not the accelerometer 113 detected speech generated by the vibrations of the vocal chords. In one embodiment, the power or energy level of the outputs of the accelerometer 113 is assessed to determine whether the vibration of the vocal chords is detected. The power may be compared to a threshold level that indicates the vibrations are found in the outputs of the accelerometer 113. In another embodiment, the VADa signal indicating voiced speech is computed using the normalized cross-correlation between any pair of the accelerometer signals (e.g. X and Y, X and Z, or Y and Z).

If the cross-correlation has values exceeding a threshold within a short delay interval the VADa indicates that the voiced speech is detected. In some embodiments, the VADa is a binary output that is generated as a voice activity detector (VAD), wherein 1 indicates that the vibrations of the vocal chords have been detected and 0 indicates that no vibrations of the vocal chords have been detected.

Using at least one of the microphones in the headset 110 (e.g., one of the microphones in the microphone array $121_1$-$121_M$, back earbud microphone $111_B$, or end earbud microphone $111_E$) or the output of a beamformer, a microphone-based VAD output (VADm) may be generated by the VAD to indicate whether or not speech is detected. This determination may be based on an analysis of the power or energy present in the acoustic signal received by the microphone. The power in the acoustic signal may be compared to a threshold that indicates that speech is present. In another embodiment, the VADm signal indicating speech is computed using the normalized cross-correlation between any pair of the microphone signals (e.g. $121_1$ and $121_M$). If the cross-correlation has values exceeding a threshold within a short delay interval the VADm indicates that the speech is detected. In some embodiments, the VADm is a binary output that is generated as a voice activity detector (VAD), wherein 1 indicates that the speech has been detected in the acoustic signals and 0 indicates that no speech has been detected in the acoustic signals.

Both the VADa and the VADm may be subject to erroneous detections of voiced speech. For instance, the VADa may falsely identify the movement of the user or the headset 100 as being vibrations of the vocal chords while the VADm may falsely identify noises in the environment as being speech in the acoustic signals. Accordingly, in one embodiment, the VAD output (VADv) is set to indicate that the user's voiced speech is detected (e.g., VADv output is set to 1) if the coincidence between the detected speech in acoustic signals (e.g., VADm) and the user's speech vibrations from the accelerometer data output signals is detected (e.g., VADa). Conversely, the VAD output is set to indicate that the user's voiced speech is not detected (e.g., VADv output is set to 0) if this coincidence is not detected. In other words, the VADv output is obtained by applying an AND function to the VADa and VADm outputs.

Figure 3:
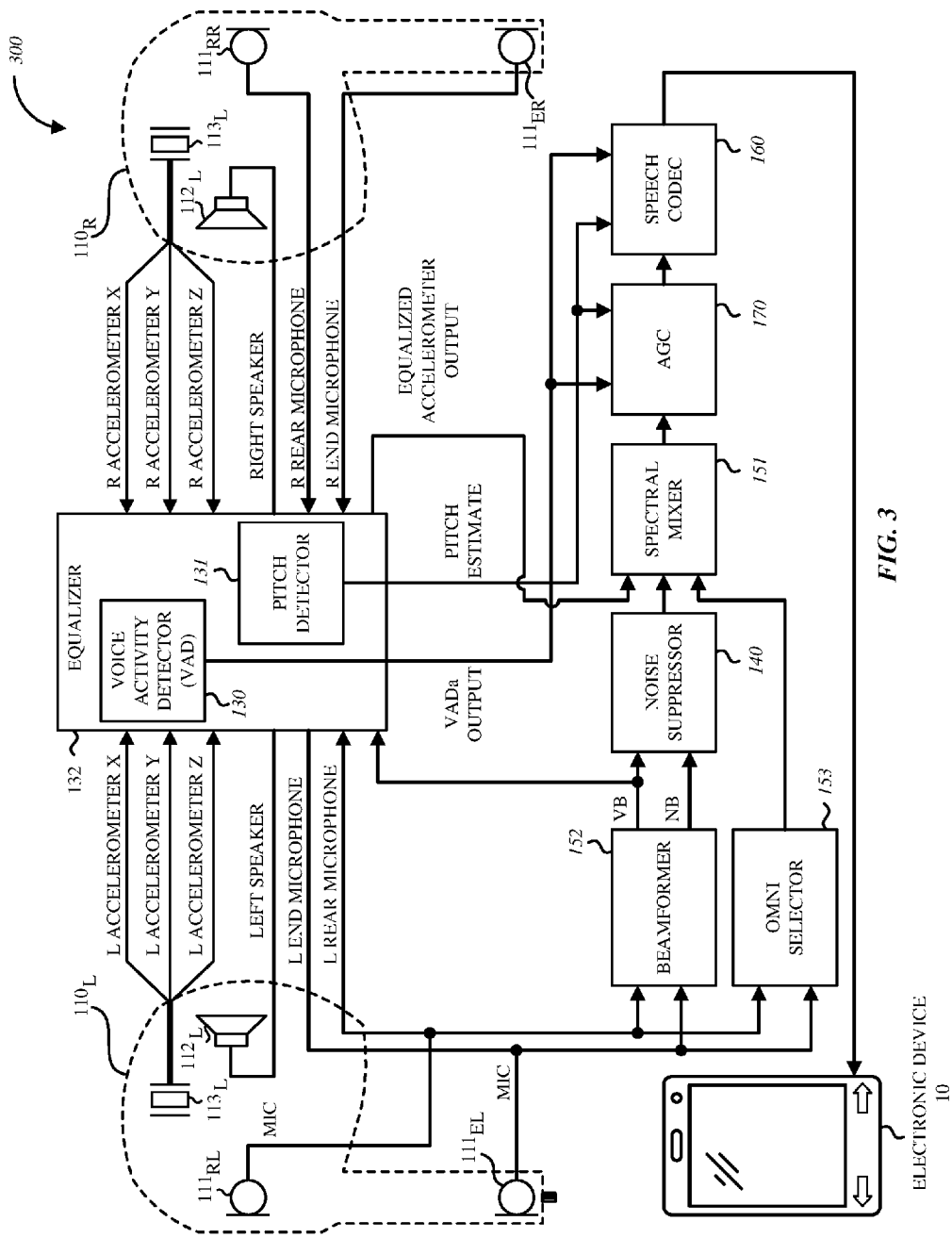
FIG. 3 illustrates a block diagram of a system for performing automatic gain control (AGC) using an accelerometer in a headset according to an embodiment of the invention.

FIG. 3 illustrates a block diagram of a system for performing automatic gain control (AGC) using an accelerometer in a headset according to an embodiment of the invention. The system 300 in FIG. 3 includes the headset 100 having the pair of earbuds 110R, 110L and an electronic device 10. The system 300 also includes an equalizer 132 that includes an accelerometer-based voice activity detector (VADa) 130 and a pitch detector 131. In other embodiments, the equalizer 132 may be separate from the VADa and separate from the pitch detector 131. The system 300 may also include a beamformer 152, an omni selector 153, a noise suppressor 140, a spectral mixer 151, an AGC controller 170, and a speech codec 160. In some embodiments, the headset 100 is coupled to the electronic device 10 wirelessly and communicates the output of the speech codec 160 to the electronic device 10. In this embodiment, the earbuds 110L, 110R include the beamformer 152, omni selector 153, noise suppressor 140, spectral mixer 151, AGC controller 170, and speech codec 160. In other embodiments, the earbuds 110L are coupled to the electronic device 10 via the headset wire 120 and the electronic device 10 include the beamformer 152, omni selector 153, noise suppressor 140, spectral mixer 151, AGC controller 170, and speech codec 160.

As shown in FIG. 3, the equalizer 132 includes the VADa 130 and the pitch detector 131. The equalizer 132 receives, from each earbud $110_L$, $110_R$, the data outputs from the accelerometers $113_L$, $113_R$, acoustic signals from the back microphones $111_{BL}$, $111_{BR}$ and from the end microphones $111_{EL}$, $111_{ER}$. In some embodiments, the equalizer 132 may also be coupled to the speakers $112_L$, $112_R$. The equalizer 132 processes the data outputs from the at least one of the accelerometers $113_L$, $113_R$ to generate an equalized accelerometer signal that is received by the spectral mixer 151.

The VADa 130 receives the accelerometer's $113_R$ signals that provide information on sensed vibrations in the x, y, and z directions and the acoustic signals received from the microphones $111_{BR}$, $111_{ER}$ and the accelerometer's $113_L$ signals that provide information on sensed vibrations in the x, y, and z directions and the acoustic signals received from the microphones $111_{BL}$, $111_{EL}$.

The accelerometer data output signals (or accelerometer signals) may be first pre-conditioned. First, the accelerometer signals are pre-conditioned by removing the DC component and the low frequency components by applying a high pass filter with a cut-off frequency of 60 Hz-70 Hz, for example. Second, the stationary noise is removed from the accelerometer signals by applying a spectral subtraction method for noise suppression. Third, the cross-talk or echo introduced in the accelerometer signals by the speakers in the earbuds may also be removed. This cross-talk or echo suppression can employ any known methods for echo cancellation. Once the accelerometer signals are pre-conditioned, the VADa 130 may use these signals to generate the VADa output. In one embodiment, the VADa output is generated by using one of the X, Y, and Z accelerometer signals which shows the highest sensitivity to the user's speech or by adding the three accelerometer signals and computing the power envelope for the resulting signal. When the power envelope is above a given threshold, the VADa output is set to 1, otherwise is set to 0. In another embodiment, the VADa signal indicating voiced speech is computed using the normalized cross-correlation between any pair of the accelerometer signals (e.g. X and Y, X and Z, or Y and Z). If the cross-correlation has values exceeding a threshold within a short delay interval the VADa indicates that the voiced speech is detected. In another embodiment, a combined VAD output is generated by computing the coincidence as a "AND" function between the VADm from one of the microphone signals or beamformer output and the VADa from one or more of the accelerometer signals (VADa). This coincidence between the VADm from the microphones and the VADa from the accelerometer signals ensures that the VAD is set to 1 only when both signals display significant correlated energy, such as the case when the user is speaking. In another embodiment, when at least one of the accelerometer signal (e.g., X, Y, or Z signals) indicates that user's speech is detected and is greater than a required threshold and the acoustic signals received from the microphones also indicates that user's speech is detected and is also greater than the required threshold, the VAD output is set to 1, otherwise is set to 0. In some embodiments, an exponential decay function and a smoothing function are further applied to the VADa output.

Referring back to FIG. 3, the pitch detector 131 may receive the accelerometer's $113_R$ and $113_L$ output signals and generate a pitch estimate based on the output signals from at least one of the accelerometers $113_R$, $113_L$. In one embodiment, the pitch detector 131 generates a pitch estimate based on (i) the acoustic signals received from at least one microphone $111_B$, $111_E$ included in a pair of earbuds $110_R$, $110_L$ and (ii) the data output by at least one accelerometer $113_R$, $113_L$ that is included in the pair of earbuds $110_R$, $110_L$.

In one embodiment, using the right earbud $110_R$ as an example, the pitch detector 131 generates the pitch estimate by using one of the X signal, Y signal, or Z signal generated by the accelerometer $113_R$ that has a highest power level. In this embodiment, the pitch detector 131 may receive from the accelerometer $113_R$ an output signal for each of the three axes (i.e., X, Y, and Z) of the accelerometer 113. The pitch detector 131 may determine a total power in each of the x, y, z signals generated by the accelerometer $113_R$, respectively, and select the X, Y, or Z signal having the highest power to be used to generate the pitch estimate. In another embodiment, the pitch detector 131 generates the pitch estimate by using a combination of the X, Y, and Z signals generated by the accelerometer $113_R$. The pitch may be computed by using the autocorrelation method or other pitch detection methods.

For instance, the pitch detector 131 may compute an average of the X, Y, and Z signals and use this combined signal to generate the pitch estimate. Alternatively, the pitch detector 131 may compute using cross-correlation a delay between the X and Y signals, a delay between the X and Z signals, and a delay between the Y and Z signals, and determine a most advanced signal from the X, Y, and Z signals based on the computed delays. For example, if the X signal is determined to be the most advanced signal, the pitch detector 131 may delay the remaining two signals (e.g., Y and Z signals). The pitch detector 131 may then compute an average of the most advanced signal (e.g., X signal) and the delayed remaining two signals (Y and Z signals) and use this combined signal to generate the pitch estimate. The pitch may be computed by using the autocorrelation method or other pitch detection methods. In one embodiment, the pitch detector 131 generates the pitch estimate based on an autocorrelation method and using the output from the at least one accelerometer $113_R$, $113_L$. As shown in FIG. 3, the pitch estimate is outputted from the pitch detector 131 to the speech codec 160.

Referring back to FIG. 3, in one embodiment, the omni selector 153 receives the acoustic signals from the back microphone $111_B$ and the end microphone $111_B$ in each of the earbuds $110_L$, $110_R$. The omni selector 153 may be an aggregate omnidirectional selector. Taking for example the right earbud $110_R$, the omni selector 153 performs a summation of the acoustic signals from the back microphone $111_{BR}$ and from the end microphone and determines whether to output (i) the summation of the acoustic signals, (ii) the acoustic signals from the back microphone $111_{BR}$, or (iii) the acoustic signals from the end microphone $111_{ER}$. For example, based on an analysis of the acoustic signals received, the omni selector 153 may determine that one of the microphones (e.g., back microphone $111_{BR}$) is occluded, such that the output of then omni selector 153 is the acoustic signal from the microphone that is determined not to be occluded (e.g., end microphone $110_{ER}$).

The beamformer 152 receive the acoustic signals from the microphones $111_B$ and $111_E$ in the each of the earbuds $110_L$, $110_R$ as illustrated in FIG. 3. The beamformer 152 may be directed or steered to the direction of the user's mouth to provide an enhanced speech signal.

In one embodiment, the VADa output may be used to steer the beamformer 152. For example, when the VADa output is set to 1, one microphone in one of the earbuds $110_L$, $110_R$ may detect the direction of the user's mouth and steer a beamformer in the direction of the user's mouth to capture the user's speech while another microphone in one of the earbuds $110_L$, $110_R$ may steer a cardioid or other beamforming patterns in the opposite direction of the user's mouth to capture the environmental noise with as little contamination of the user's speech as possible. In this embodiment, when the VADa output is set to 0, one or more microphones in one of the earbuds $110_L$, $110_R$ may detect the direction and steer a second beamformer in the direction of the main noise source or in the direction of the individual noise sources from the environment.

In the embodiment illustrated in FIG. 1, the user in the left part of FIG. 1 is speaking while the user in the right part of FIG. 1 is not speaking. When the VAD output is set to 1, at least one of the microphones in the headset 100 is enabled to detect the direction of the user's mouth. The same or another microphone in the headset 100 creates a beamforming pattern in the direction of the user's mouth, which is used to capture the user's speech. Accordingly, the beamformer outputs an enhanced speech signal. When the VADa output is 0, the same or another microphone in the headset 100 may create a cardioid beamforming pattern or other beamforming patterns in the direction opposite to the user's mouth, which is used to capture the environmental noise. When the VADa output is 0, other microphones in the headset 100 may create beamforming patterns (not shown in FIG. 1) in the directions of individual environmental noise sources. When the VADa output is 0, the microphones in the headset 100 is not enabled to detect the direction of the user's mouth, but rather the beamformer is maintained at its previous setting. In this manner, the VADa output is used to detect and track both the user's speech and the environmental noise. The microphones in the headset 100 are generating beams in the direction of the mouth of the user in the left part of FIG. 1 to capture the user's speech (voice beam) and in the direction opposite to the direction of the user's mouth in the right part of FIG. 1 to capture the environmental noise (noise beam).

Referring back to FIG. 3, using the beamforming methods described above, the beamformer 152 generates a voice beam signal and a noise beam signal that are output to the noise suppressor 140. The voice beam signal is also be transmitted to the equalizer 152. The equalizer 152 may use the voice beam signal to process the data outputs from the at least one of the accelerometers $113_L$, $113_R$ to generate an equalized accelerometer signal that is outputted to the spectral mixer 151. In some embodiments, the voice beam signal is used by the VAD to generate a VADm output as discussed above.

The voice beam signal and the noise beam signal are also outputted to the noise suppressor 140. The noise suppressor 140 may be a 2-channel noise suppressor that can perform adequately for both stationary and non-stationary noise estimation. In one embodiment, the noise suppressor 140 includes a two-channel noise estimator that produces noise estimates that are noise estimate vectors, where the vectors have several spectral noise estimate components, each being a value associated with a different audio frequency bin. This is based on a frequency domain representation of the discrete time audio signal, within a given time interval or frame.

According to an embodiment of the invention, a two-channel noise estimator may compute a noise estimate as its output, which may estimate the noise in the signal from the voice beam signal, using the following formula $$V_2(k) = X_2(k) - \Delta X(k)\frac{1}{MR-1} \qquad (1)$$

$$MR = \frac{H_1(k)}{H_2(k)} \quad (2)$$

where $V_2(k)$ is the spectral component in frequency bin k of the noise from the noise beam signal, $X_2(k)$ is the spectral component of the audio signal from noise beam signal (at frequency bin k), $$\Delta X(k) = |X_1(k)| - |X_2(k)|$$

where $\Delta X(k)$ is the difference in spectral component k of the magnitudes, or in some cases the power or energy, of the voice beam and the noise beam signals $X_1$ and $X_2$, and $H_1(k)$ is the spectral component at frequency bin k of the transfer function of the voice beam signal and $H_2(k)$ is the spectral component at frequency bin k of the transfer function of the noise beam signal. In equation (1) above, the quantity MR is affected by several factors.

The noise suppressor 140 then uses the output noise estimate generated by the two-channel noise estimator to attenuate the voice beam signal. The action of the noise suppressor 140 may be in accordance with a conventional gain versus SNR curve, where typically the attenuation is greater when the noise estimate is greater. The attenuation may be applied in the frequency domain, on a per frequency bin basis, and in accordance with a per frequency bin noise estimate which is provided by the two-channel noise estimator. The noise suppressed voice beam signal (e.g., clean beamformer signal) is then outputted to the spectral mixer 151.

Referring to the FIG. 3, the spectral mixer 151 receives (i) the equalized accelerometer signal, (ii) the clean beamformer signal, and (iii) the omni signal. The spectral mixer 151 performs spectral mixing of the received signals to generate a mixed signal. In one embodiment, the spectral mixer 151 generates a mixed signal that includes the equalized accelerometer signal to account for the low frequency band (e.g., 800 Hz and under) of the mixed signal, a combination of the clean beamformer signal and the omni signal (e.g., 10% omni signal, 90% clean beamformer signal) for the mid-range frequency band (e.g., 800 Hz-4000 Hz) of the mixed signal, and the clean beamformer signal to account for the high frequency band (e.g., over 4000 Hz).

The AGC controller 170 receives the mixed signal from the spectral mixer 151 and performs AGC on the mixed signal based on the VADa output received from the VADa 130. In some embodiments, the AGC controller 170 may also perform AGC on the mixed signal based on the pitch estimate from the pitch detector 131.

The speech codec 160 receives the AGC output from the AGC controller 170 and performs encoding on the AGC output based on the VADa output from the VADa 130. The speech codec 160 may also receive the pitch estimate that is outputted from the pitch detector 131. The speech codec 160 may correct a pitch component of the AGC output using the VADa output and the pitch estimate to generate an enhanced speech final output.

Figure 4:
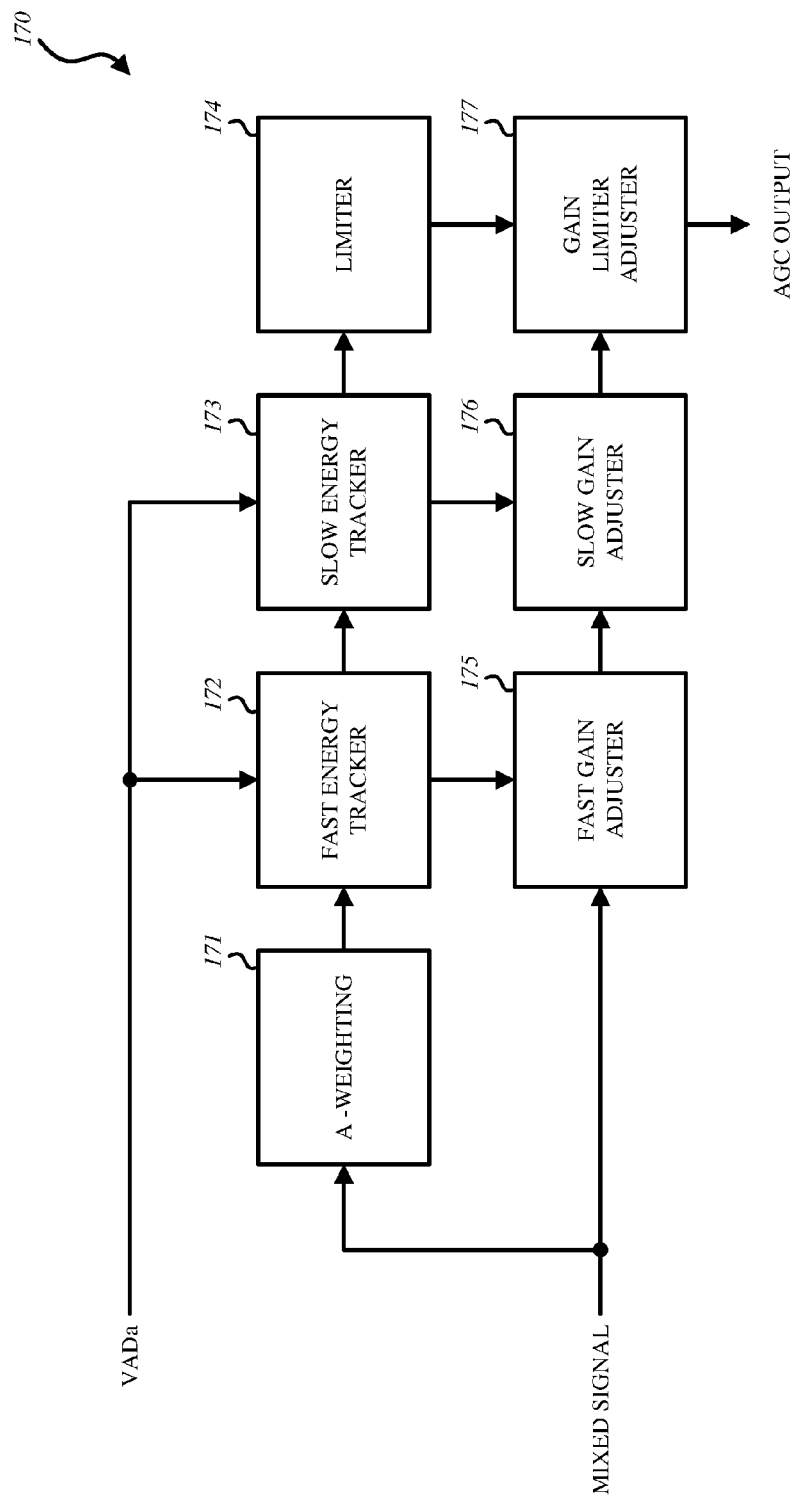
FIG. 4 illustrates a block diagram of the details of the AGC controller included in the system in FIG. 3 for performing automatic gain control (AGC) using an accelerometer in a headset according to one embodiment of the invention.

FIG. 4 illustrates a block diagram of the details of the AGC controller 170 included in the system in FIG. 3 for performing automatic gain control (AGC) using an accelerometer in a headset according to one embodiment of the invention. The AGC controller 170 includes an A-weighting controller 171, a fast energy tracker 172, a slow energy tracker 173, a limiter 174, a fast gain adjuster 175, a slow gain adjuster 176, and a gain limiter adjuster 177.

The A-weighting controller 171 receives the mixed signal from the spectral mixer 151. The A-weighting controller 171 applies A-weighting to the mixed signal to generate an average or peak output signal level. While an A-weighting controller 171 that applies A-weighting to the mixed signal is illustrated in FIG. 4, it is understood that any suitable method to determine the average or peak output signal level of the mixed signal may be used.

The average or peak output signal level is outputted to the fast energy tracker 172, the slow energy tracker 173, and the limiter 174. The fast energy tracker 172 and the slow energy tracker 173 also receive the VADa output from the VADa 130. The fast energy tracker 172 generates a fast gain level (e.g., in dB) based on the average or peak output signal level and the VADa output. The fast gain level is outputted to the fast gain adjuster 175 that adjusts the mixed signal by the fast gain level.

The slow energy tracker 173 generates a centering gain level (e.g. in dB) based on the average or peak output signal level and the VADa output. The centering gain level is outputted to the slow gain adjuster 176 that adjusts the output of the fast gain adjuster 175 by the centering gain level. In some embodiments, the slow energy tracker 173 also receives the output from the fast gain tracker 172.

In some embodiments, the limiter 174 receives the average or peak output signal level as well as the output from the slow energy tracker 173. The limiter 174 generates a limiter gain level (e.g., in dB) based on at least one of the average or peak output signal or the output from the slow energy tracker 173. The limiter gain level is outputted to the limiter adjuster 177 that adjusts the output of the slow gain adjuster 176 by the limiter gain level. The output of the limiter adjuster 177 is the AGC output. In some embodiments, the AGC controller performs AGC by controlling the fast energy tracker and slow energy tracker by the VADa output to generate a fast gain and a slow gain.

The following embodiments of the invention may be described as a process, which is usually depicted as a flowchart, a flow diagram, a structure diagram, or a block diagram. Although a flowchart may describe the operations as a sequential process, many of the operations can be performed in parallel or concurrently. In addition, the order of the operations may be re-arranged. A process is terminated when its operations are completed. A process may correspond to a method, a procedure, etc.

Figure 5:
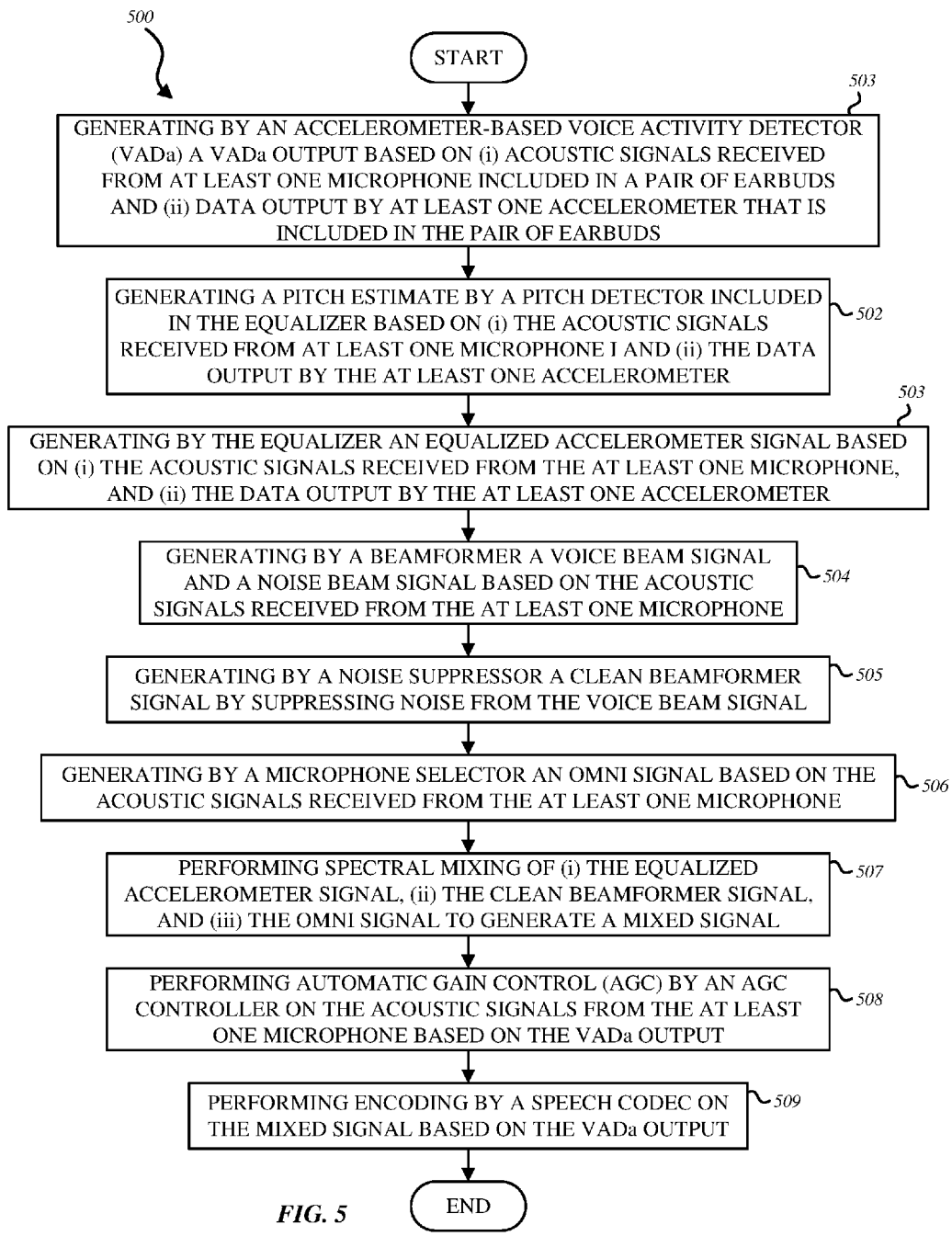
FIG. 5 illustrates a flow diagram of an example method of improving voice quality in a mobile device according to one embodiment of the invention.

FIG. 5 illustrates a flow diagram of an example method of improving voice quality in a mobile device according to one embodiment of the invention. The method 500 starts with an accelerometer-based voice activity detector (VADa) generating a VADa output based on (i) acoustic signals received from at least one microphone included in a pair of earbuds and (ii) data output by at least one accelerometer that is included in the pair of earbuds (Block 501). The VADa may be included in an equalizer.

At Block 502, a pitch detector that is included in the equalizer generates a pitch estimate based on (i) the acoustic signals received from at least one microphone and (ii) the data output by the at least one accelerometer. In one embodiment, the pitch detector generates the pitch estimate based on an autocorrelation method and using the output from the at least one accelerometer. The pitch estimate may be obtained by (i) using an X, Y, or Z signal generated by the at least one accelerometer that has a highest power level or (ii) using a combination of the X, Y, and Z signals generated by the at least one accelerometer.

At Block 503, the equalizer generates an equalized accelerometer signal based on (i) the acoustic signals received from the at least one microphone, and (ii) the data output by the at least one accelerometer.

At Block 504, a beamformer generates a voice beam signal and a noise beam signal based on the acoustic signals received from the at least one microphone. At Block 505, a noise suppressor generates a clean beamformer signal by suppressing noise from the voice beam signal. In one embodiment, the noise suppressor includes a two-channel noise estimator to generate a noise estimate that is used by the noise suppressor to attenuate (or suppress) the noise from the voice beam signal.

At Block 506, an omni selector generates an omni signal based on the acoustic signals received from at least one microphone. For each earbud, the omni selector may performs a summation of the acoustic signals from the microphones included in the earbud, and determines whether to output (i) the summation of the acoustic signals, (ii) the acoustic signals from the one microphone (e.g., $111_{BR}$), or (iii) the acoustic signals from another microphone (e.g., $111_{ER}$).

At Block 507, a spectral mixer performs spectral mixing of (i) the equalized accelerometer signal, (ii) the clean beamformer signal, and (iii) the omni signal to generate a mixed signal. In one embodiment, the spectral mixer generates a mixed signal that includes the equalized accelerometer signal to account for the low frequency band (e.g., 800 Hz and under) of the mixed signal, a combination of the clean beamformer signal and the omni signal (e.g., 10% omni signal, 90% clean beamformer signal) for the midrange frequency band (e.g., 800 Hz-4000 Hz) of the mixed signal, and the clean beamformer signal to account for the high frequency band (e.g., over 4000 Hz).

At Block 508, the AGC controller performs automatic gain control (AGC) on the acoustic signals from the at least one microphone based on the VADa output. In one embodiment, the AGC controller performs AGC on the mixed signal based on the VADa output and the pitch estimate.

At Block 509, a speech codec performs encoding on the mixed signal based on the VADa output. In some embodiments, the speech codec performs encoding on the mixed signal based on the pitch estimate.

Figure 6:
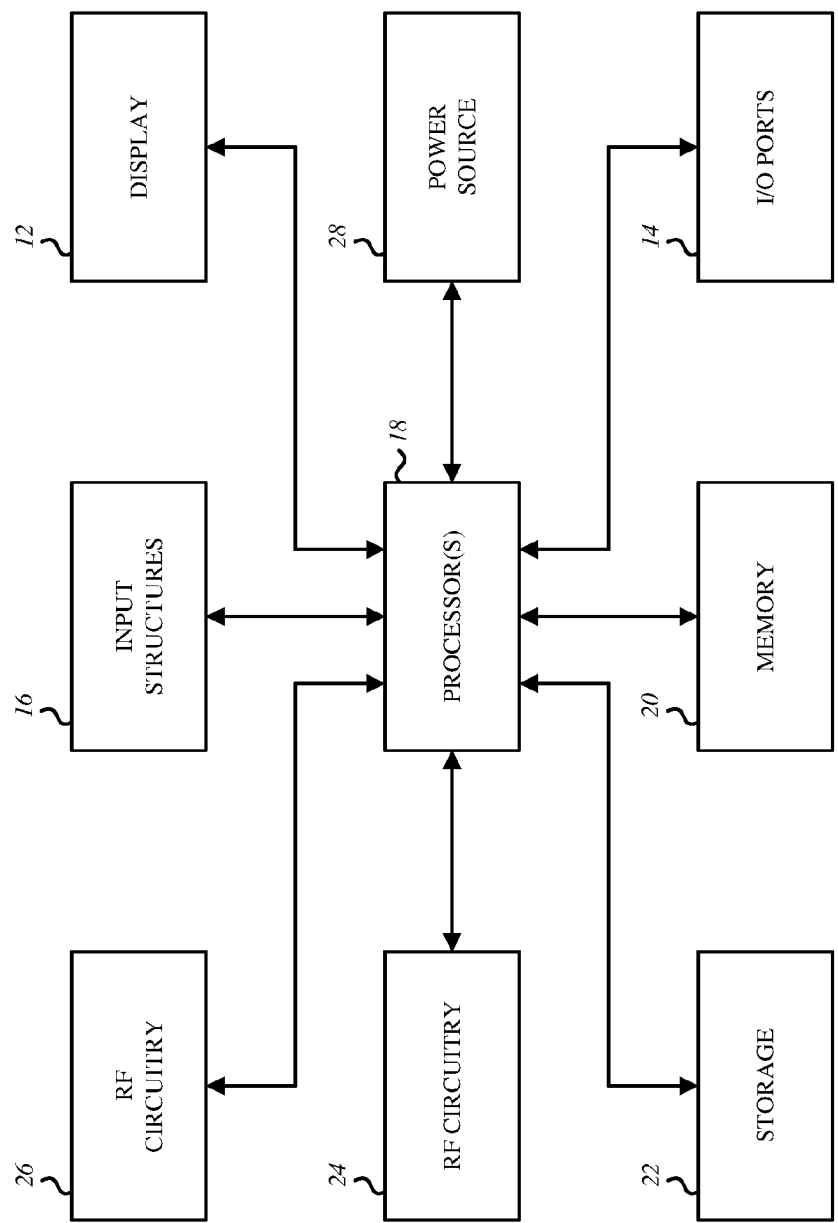
FIG. 6 is a block diagram of exemplary components of a mobile device included in the system in FIG. 3 for performing automatic gain control (AGC) using an accelerometer in a headset in accordance with aspects of the present disclosure.

FIG. 6 is a block diagram of exemplary components of an electronic device 10 included in the system in FIG. 3 for performing automatic gain control (AGC) using an accelerometer in a headset in accordance with aspects of the present disclosure. Specifically, FIG. 6 is a block diagram depicting various components that may be present in electronic devices suitable for use with the present techniques. The electronic device 10 may be in the form of a computer, a handheld portable electronic device such as a cellular phone, a mobile device, a personal data organizer, a computing device having a tablet-style form factor, etc. These types of electronic devices, as well as other electronic devices providing comparable voice communications capabilities (e.g., VoIP, telephone communications, etc.), may be used in conjunction with the present techniques.

Keeping the above points in mind, FIG. 6 is a block diagram illustrating components that may be present in one such electronic device 10, and which may allow the device 10 to function in accordance with the techniques discussed herein. The various functional blocks shown in FIG. 6 may include hardware elements (including circuitry), software elements (including computer code stored on a computer-readable medium, such as a hard drive or system memory), or a combination of both hardware and software elements. It should be noted that FIG. 6 is merely one example of a particular implementation and is merely intended to illustrate the types of components that may be present in the electronic device 10. For example, in the illustrated embodiment, these components may include a display 12, input/output (I/O) ports 14, input structures 16, one or more processors 18, memory device(s) 20, non-volatile storage 22, expansion card(s) 24, RF circuitry 26, and power source 28.

An embodiment of the invention may be a machine-readable medium having stored thereon instructions which program a processor to perform some or all of the operations described above. A machine-readable medium may include any mechanism for storing or transmitting information in a form readable by a machine (e.g., a computer), such as Compact Disc Read-Only Memory (CD-ROMs), Read-Only Memory (ROMs), Random Access Memory (RAM), and Erasable Programmable Read-Only Memory (EPROM). In other embodiments, some of these operations might be performed by specific hardware components that contain hardwired logic. Those operations might alternatively be performed by any combination of programmable computer components and fixed hardware circuit components.

While the invention has been described in terms of several embodiments, those of ordinary skill in the art will recognize that the invention is not limited to the embodiments described, but can be practiced with modification and alteration within the spirit and scope of the appended claims. The description is thus to be regarded as illustrative instead of limiting. There are numerous other variations to different aspects of the invention described above, which in the interest of conciseness have not been provided in detail. Accordingly, other embodiments are within the scope of the claims.

The invention claimed is:

1. A method of performing automatic gain control (AGC) using an accelerometer in a headset comprising:

generating by an accelerometer-based voice activity detector (VADa) a VADa output based on (i) acoustic signals received from at least one microphone included in a pair of earbuds and (ii) data output by at least one accelerometer that is included in the pair of earbuds, the at least one accelerometer to detect vibration of a user's vocal chords, the headset including the pair of earbuds, wherein generating the VADa output comprises at least one of:

(i) computing a power envelope of at least one of x, y, z direction signals generated by the at least one accelerometer, and setting the VADa output to indicate that a user's voiced speech is detected if the power envelope is greater than a power envelope threshold and setting the VADa output to indicate that the user's voiced speech is not detected if the power envelope is less than the power envelope threshold, and/or (ii) computing a normalized cross-correlation between any pair of the x, y, z direction signals generated by the at least one accelerometer, setting the VADa output to indicate that the user's voiced speech is detected if the normalized cross-correlation is greater than a threshold within a predetermined delay, and setting the VADa output to indicate that the user's voiced speech is not detected if the normalized cross-correlation is less than the threshold; and performing automatic gain control (AGC) by an AGC controller on the acoustic signals from the at least one microphone based on the VADa output.

2. The method of claim 1, wherein generating the VADa output further comprises:
applying an exponential decay function and a smoothing function to the VADa output.

3. The method of claim 1, wherein the VADa is included in an equalizer.

4. The method of claim 3, further comprising:
generating by an equalizer an equalized accelerometer signal based on (i) the acoustic signals received from the at least one microphone, and (ii) the data output by the at least one accelerometer.

5. The method of claim 4, further comprising:
generating by a beamformer a voice beam signal and a noise beam signal based on the acoustic signals received from the at least one microphone included in the pair of earbuds;
generating by a noise suppressor a clean beamformer signal by suppressing noise from the voice beam signal, wherein the noise suppressor receives the voice beam signal and the noise beam signal.

6. The method of claim 5, further comprising:
generating by an omni selector an omni signal based on the acoustic signals received from the at least two microphones included in the pair of earbuds.

7. The method of claim 6, further comprising:
performing spectral mixing of (i) the equalized accelerometer signal, (ii) the clean beamformer signal, and (iii) the omni signal to generate a mixed signal.

8. The method of claim 7, wherein performing AGC by the AGC controller includes:
performing AGC by the AGC controller on the mixed signal based on the VADa output.

9. The method of claim 8, wherein performing AGC by the AGC controller includes:
controlling a fast energy tracker and a slow energy tracker by the VADa output, to generate a fast gain and a slow gain.

10. The method of claim 9, further comprising:
performing encoding by a speech codec on the AGC output based on the VADa output.

11. The method of claim 10, further comprising:
generating a pitch estimate by a pitch detector based on (i) the acoustic signals received from at least one microphone included in a pair of earbuds and (ii) the data output by at least one accelerometer that is included in the pair of earbuds.

12. The method of claim 11, wherein the pitch detector generates the pitch estimate based on an autocorrelation method and using the output from the at least one accelerometer, wherein the pitch estimate is obtained by (i) using an X, Y, or Z signal generated by the at least one accelerometer that has a highest power level or (ii) using a combination of the X, Y, and Z signals generated by the at least one accelerometer.

13. The method of claim 12, wherein performing AGC by the AGC controller includes:
performing AGC by the AGC controller on the mixed signal based on the VADa output and the pitch estimate.

14. A system for performing automatic gain control (AGC) using an accelerometer in a headset comprising:
the headset including a pair of earbuds, wherein each of the earbuds includes at least one microphone and at least one accelerometer to detect vibration of a user's vocal chords,
an accelerometer-based voice activity detector (VADa) to generate a VADa output based on (i) acoustic signals received from the at least one microphone included in the pair of earbuds and (ii) data output by the at least one accelerometer that is included in the pair of earbuds,
wherein generating the VADa output comprises at least one of:
(i) computing a power envelope of at least one of x, y, z direction signals generated by the at least one accelerometer, and setting the VADa output to indicate that a user's voiced speech is detected if the power envelope is greater than a power envelope threshold and setting the VADa output to indicate that the user's voiced speech is not detected if the power envelope is less than the power envelope threshold, and/or
(ii) computing a normalized cross-correlation between any pair of the x, y, z direction signals generated by the at least one accelerometer, setting the VADa output to indicate that the user's voiced speech is detected if the normalized cross-correlation is greater than a threshold within a delay, and setting the VADa output to indicate that the user's voiced speech is not detected if the normalized cross-correlation is less than the threshold; and
an AGC controller to perform AGC on the acoustic signals from the at least one microphone based on the VADa output.

15. The system of claim 14, wherein the VADa generates the VADa output by:
applying an exponential decay function and a smoothing function to the VADa output.

16. The system of claim 14, further comprising an equalizer to generate an equalized accelerometer signal based on (i) the acoustic signals received from the at least one microphone, and (ii) the data output by the at least one accelerometer.

17. The system of claim 16, further comprising:
a beamformer to generate a voice beam signal and a noise beam signal based on the acoustic signals received from the at least one microphone included in the pair of earbuds;
a noise suppressor to generate a clean beamformer signal by suppressing noise from the voice beam signal, wherein the noise suppressor receives the voice beam signal and the noise beam signal.

18. The system of claim 17, further comprising:
a omni selector generating an omni signal based on the acoustic signals received from the at least two microphones included in the pair of earbuds.

19. The system of claim 18, further comprising:
a spectral mixer to perform spectral mixing of (i) the equalized accelerometer signal, (ii) the clean beamformer signal, and (iii) the omni signal to generate a mixed signal.

20. The system of claim 19, wherein the AGC controller performs AGC on the mixed signal based on the VADa output.

21. The system of claim 20, wherein the AGC controller performs AGC by controlling a fast energy tracker and a slow energy tracker by the VADa output to generate a fast gain and a slow gain.

22. The system of claim 21, further comprising:
a speech codec performing encoding on the AGC output based on the VADa output.

23. The system of claim 22, further comprising:
a pitch detector to generate a pitch estimate based on (i) the acoustic signals received from at least one microphone included in a pair of earbuds and (ii) the data output by at least one accelerometer that is included in the pair of earbuds.

24. The system of claim 23, wherein the pitch detector generates the pitch estimate based on an autocorrelation method and using the output from the at least one accelerometer, wherein the pitch estimate is obtained by (i) using an X, Y, or Z signal generated by the at least one accelerometer that has a highest power level or (ii) using a combination of the X, Y, and Z signals generated by the at least one accelerometer.

25. The system of claim 24, wherein the AGC controller performs AGC on the mixed signal based on the VADa output and the pitch estimate.

26. A non-transitory computer-readable medium having stored thereon instructions, when executed by a processor, causes the processor to perform a method of performing automatic gain control (AGC) using an accelerometer in a headset, the method comprising:

generating by an accelerometer-based voice activity detector (VADa) a VADa output based on (i) acoustic signals received from at least one microphone included in a pair of earbuds and (ii) data output by at least one accelerometer that is included in the pair of earbuds, the at least one accelerometer to detect vibration of the user's vocal chords, the headset including the pair of earbuds, wherein generating the VADa output comprises at least one of:
(i) computing a power envelope of at least one of x, y, z signals generated by the at least one accelerometer, and setting the VADa output to indicate that a user's voiced speech is detected if the power envelope is greater than a power envelope threshold and setting the VADa output to indicate that the user's voiced speech is not detected if the power envelope is less than the power envelope threshold, and/or
(ii) computing the normalized cross-correlation between any pair of x, y, z direction signals generated by the at least one accelerometer, setting the VADa output to indicate that the user's voiced speech is detected if normalized cross-correlation is greater than a threshold within a delay, and setting the VADa output to indicate that the user's voiced speech is not detected if the normalized cross-correlation is less than the threshold; and performing automatic gain control (AGC) by an AGC controller on the acoustic signals from the at least one microphone based on the VADa output.

* * * * *